United States Patent [19]
Osada

[11] Patent Number: 5,874,324
[45] Date of Patent: Feb. 23, 1999

[54] METHOD OF SEALING ELECTRONIC COMPONENT WITH MOLDED RESIN

[75] Inventor: Michio Osada, Kyoto, Japan

[73] Assignee: Towa Corporation, Kyoto, Japan

[21] Appl. No.: 813,700

[22] Filed: Mar. 6, 1997

[30] Foreign Application Priority Data

Mar. 14, 1996 [JP] Japan ................................. 8-087569
Dec. 25, 1996 [JP] Japan ................................. 8-357294

[51] Int. Cl.$^6$ ..................................................... H01L 21/44
[52] U.S. Cl. ...................... 438/124; 438/127; 264/272.17
[58] Field of Search ................................... 438/112, 124, 438/125, 126, 127; 264/272.17

[56] References Cited

U.S. PATENT DOCUMENTS

| 4,888,307 | 12/1989 | Spairisano et al. | 438/124 |
| 5,447,888 | 9/1995 | Takashima et al. | 438/124 |
| 5,674,343 | 10/1997 | Hotta et al. | 264/272.17 |
| 5,753,538 | 5/1998 | Kuno et al. | 438/127 |

*Primary Examiner*—Kevin M. Picardat
*Attorney, Agent, or Firm*—W. F. Fasse; W. G. Fasse

[57] ABSTRACT

A method of sealing an electronic component with molded resin comprises an electronic component setting step of engaging an electronic component mounted on a lead frame in mold cavities which are provided on mold surfaces of a fixed mold section and a movable mold section respectively to be opposed to each other, and a resin sealing step of charging a heated/melted resin material in the mold cavities engaged with the electronic component and sealing the electronic component received in the mold cavities and the lead frame around the same in a resin mold package corresponding to the shapes of the mold cavities. The resin sealing step is carried out by applying a prescribed resin pressure to the resin charged in the mold cavities and thereafter pressing the resin received in the mold cavities against the lead frame from the exterior.

According to this method, adhesion between the resin mold package molded in the mold cavities and the lead frame is improved, whereby these members are prevented from defining a clearance therebetween and water is prevented from infiltrating from therebetween, and the quality and the reliability of the product can be improved.

16 Claims, 7 Drawing Sheets

METHOD OF SEALING ELECTRONIC COMPONENT WITH MOLDED RESIN

BACKGROUND OF THE INVENTION

1. Field of the Invention

The present invention relates to an improvement of a method of sealing an electronic component with molded resin for sealing an electronic component such as an IC, an LSI, a diode, a capacitor or the like which is mounted on a lead frame with a resin material.

2. Description of the Background Art

In general, an electronic component is sealed with molded resin by transfer molding. In general, this method is carried out through a mold assembly for sealing an electronic component with resin as follows:

A fixed upper mold section and a movable lower mold section of the mold assembly are previously heated to a resin molding temperature with heating means, and the upper and lower mold sections are opened.

Then, a lead frame provided with an electronic component is supplied to/set on a prescribed position of a mold surface of the lower mold section, while a resin material is supplied into pots of the lower mold section.

Then, the lower mold section is upwardly moved to close the upper and lower mold sections. At this time, the electronic component and the lead frame around the same are engaged and set in upper and lower mold cavities which are oppositely provided on the mold surfaces of the upper and lower mold sections respectively, while the resin material received in the pots is heated and successively melted.

Then, the resin material heated/melted in the pots is pressed with plungers to be injected into and charged in the upper and lower mold cavities through resin passages, whereby the electronic component and the lead frame around the same received in the mold cavities are sealed in a resin mold package which is molded in correspondence to the shapes of the mold cavities.

After a lapse of a time which is necessary for hardening the melted resin material, the upper and lower mold sections are opened so that the resin mold package and the lead frame in the upper and lower mold cavities and the hardened resin in the resin passages are released from the mold assembly with ejector pins provided on the mold sections respectively.

Although the heated/melted resin material is injected into and charged in the mold cavities and a prescribed resin pressure (resin pressing force) is applied to the resin injected into and charged in the mold cavities with the plungers, however, adhesion (adhesiveness) between the resin mold package molded in the mold cavities and the lead frame is so weak that a clearance is disadvantageously readily defined between the resin mold package and the lead frame.

Namely, water infiltrates from the clearance and inhibits the function of the electronic component sealed in the resin mold package, to disadvantageously deteriorate the quality of the product (resin mold package) and damage its reliability.

SUMMARY OF THE INVENTION

An object of the present invention is to provide a method of sealing an electronic component with molded resin, which improves adhesion between a resin mold package molded in mold cavities of a mold assembly and a lead frame.

Another object of the present invention is to improve adhesion between a resin mold package molded in mold cavities of a mold assembly and a lead frame for inhibiting the resin mold package and the lead frame from defining a clearance therebetween while preventing infiltration of water from between the resin mold package and the lead frame, thereby obtaining a product having high quality and high reliability as a result.

In order to attain the aforementioned objects, the inventive method of sealing an electronic component with molded resin comprises an electronic component setting step of engaging an electronic component which is mounted on a lead frame in mold cavities oppositely provided on mold surfaces of fixed and movable mold sections respectively, and a resin sealing step of charging a heated/melted resin material in the mold cavities receiving the electronic component and sealing the electronic component received in the mold cavities and the lead frame around the same in a resin mold package corresponding to the shapes of the mold cavities.

The feature of the inventive method resides in that the resin sealing step comprises steps of applying a prescribed resin pressure to the resin material charged in the mold cavities, and thereafter pressing the resin received in the mold cavities against surfaces of the lead frame from the exterior.

According to the present invention, the adhesion between the resin mold package molded in the mold cavities and the lead frame is improved due to the aforementioned steps of applying a prescribed resin pressure to the resin charged in the mold cavities and thereafter pressing the resin received in the mold cavities against the surfaces of the lead frame from the exterior. Thus, the resin mold package and the lead frame are prevented from defining a clearance therebetween while water is prevented from infiltrating from between the resin mold package and the lead frame, whereby the quality and reliability of the product can be improved.

In a preferred embodiment of the present invention, the step of pressing the resin received in the mold cavities is carried out by feeding compressed air to the resin received in the mold cavities under pressure.

In another preferred embodiment of the present invention, the method further comprises a step of covering inner surfaces of the mold cavities with mold releasing films along the shapes of the mold cavities, and the step of pressing the resin received in the mold cavities is carried out by feeding compressed air into the mold cavities whose inner surfaces are covered with the mold releasing films under pressure and pressing the resin received in the mold cavities through the mold releasing films.

When the resin received in the mold cavities is pressed through the mold releasing films in the aforementioned manner, mold releasability of the molded product is improved in relation to the mold cavities without damaging the adhesion between the resin mold package molded in the mold cavities and the lead frame.

In still another preferred embodiment of the present invention, the step of pressing the resin received in the mold cavities is carried out by pressing the resin in the mold cavities against the surfaces of the lead frame from the exterior with pressing members provided on bottom surface portions of the mold cavities.

In a further preferred embodiment of the present invention, the step of pressing the resin received in the mold cavities is carried out by closing the fixed and movable mold sections which are closed with a prescribed low closing pressure further with a prescribed high closing pressure.

In a further preferred embodiment of the present invention, the method further comprises a step of mounting heat radiating plates on inner bottom surfaces of the mold cavities, and the step of pressing the resin received in the mold cavities is carried out by feeding compressed air to the heat radiating plates under pressure from the exterior thereby pressing the resin against the surfaces of the lead frame through the heat radiating plates.

In a further preferred embodiment of the present invention, the method further comprises a step of mounting heat radiating plates on inner bottom surfaces of the mold cavities, cavity bottom surface members provided on bottom surfaces of the mold cavities are prepared from porous materials having continuous pores opened on surfaces closer to the bottom surfaces of the mold cavities, and the step of pressing the resin received in the mold cavities is carried out by feeding compressed air into the mold cavities under pressure through the continuous pores, thereby pressing the resin against the lead frame through the heat radiating plates.

In a further preferred embodiment of the present invention, the method further comprises a step of covering inner surfaces of the mold cavities with mold releasing films along the shapes of the mold cavities, mold members comprising at least the mold cavities are prepared from porous materials having continuous pores opened in the overall inner surfaces of the mold cavities, and the step of pressing the resin received in the mold cavities is carried out by feeding compressed air into the mold cavities having the inner surfaces covered with the mold releasing films under pressure through the continuous pores and pressing the resin received in the mold cavities through the mold releasing films.

In a further preferred embodiment of the present invention, the step of pressing the resin received in the mold cavities is carried out by feeding compressed air into the mold cavities under pressure when the resin charged in the mold cavities is not yet completely hardened but still in a substantially semi-hardened state.

In a further preferred embodiment of the present invention, the step of pressing the resin received in the mold cavities is carried out by feeding compressed air into the mold cavities under pressure when the melted resin material is completely charged in the mold cavities.

In a further preferred embodiment of the present invention, the step of pressing the resin received in the mold cavities is carried out by feeding compressed air into the mold cavities under pressure immediately after reduction of the resin pressure in the mold cavities is started by hardening of the resin in the mold cavities.

In a further preferred embodiment of the present invention, the step of pressing the resin received in the mold cavities is carried out by continuously feeding compressed air into the mold cavities under pressure during reduction of the resin pressure in the mold cavities due to hardening of the resin in the mold cavities.

In a further preferred embodiment of the present invention, the step of pressing the resin received in the mold cavities is carried out by feeding compressed air into the mold cavities under pressure when reduction of the resin pressure in the mold cavities is completely ended by hardening of the resin in the mold cavities.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Figure 1:
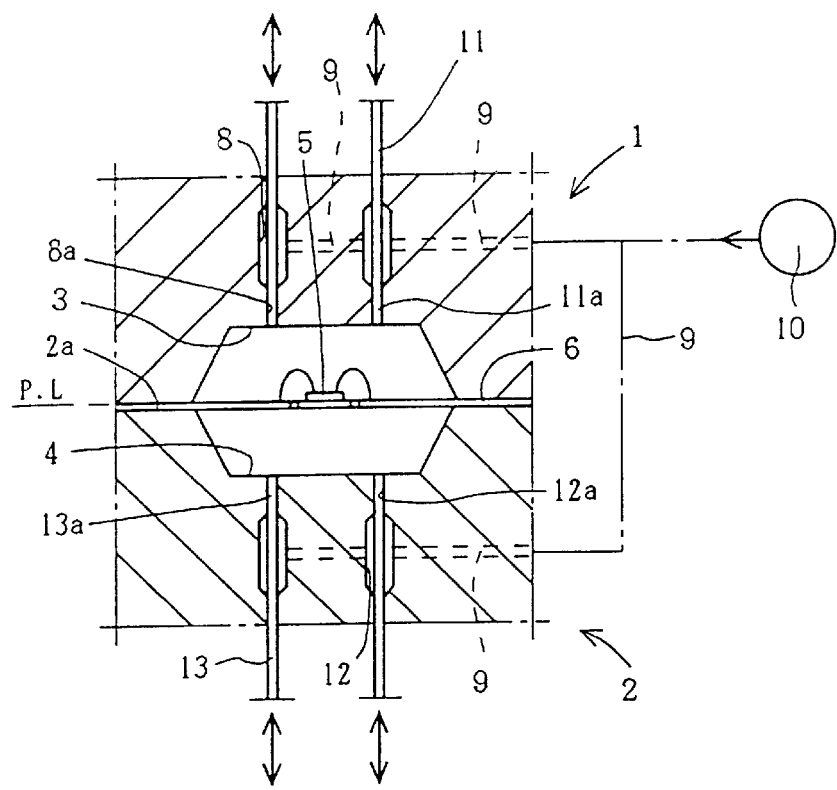
FIG. 1 is a schematic longitudinal sectional view showing a principal part of a mold assembly for resin sealing for carrying out the method according to the present invention, illustrating mold cavities of the mold assembly not yet charged with melted resin injected thereinto.
Figure 2:
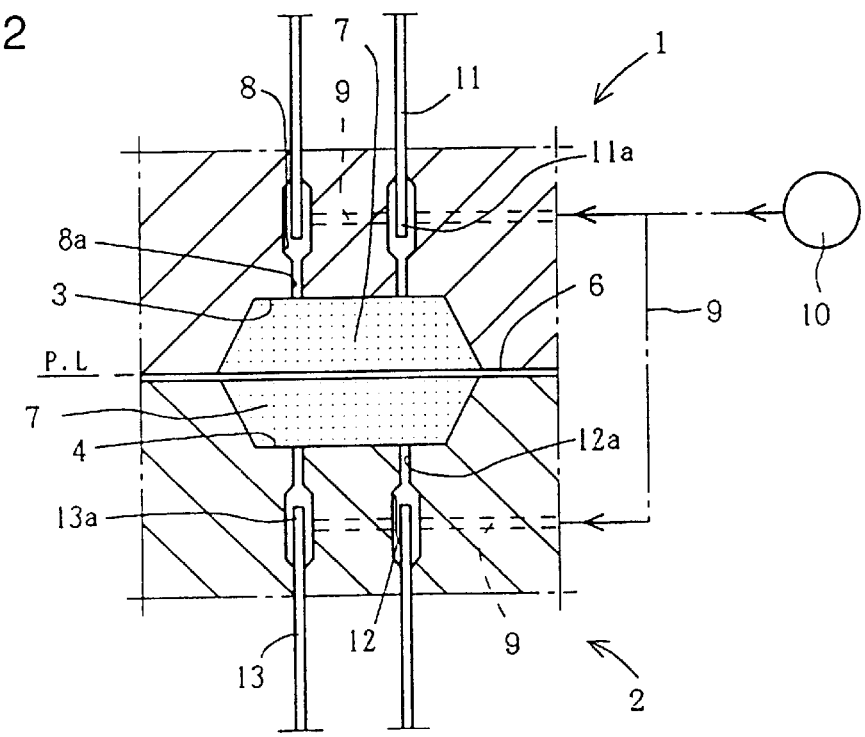
FIG. 2 is a schematic longitudinal sectional view showing the principal part of the mold assembly for resin sealing corresponding to FIG. 1, illustrating a state of feeding compressed air to resin received in the mold cavities of the mold assembly under pressure.

FIGS. 1 and 2 show a principal part of a mold in a mold assembly according to an embodiment of the present invention. This mold is formed by a fixed upper mold section (fixed mold section) 1 and a movable lower mold section (movable mold section) 2 which is opposed to the fixed upper mold section 1.

A necessary number of upper mold cavities 3 for molding resin are provided on a mold surface of the upper mold section 1, while lower mold cavities 4 for molding resin are provided on a mold surface of the lower mold section 2, to be opposed to the upper mold cavities 3.

The upper and lower mold sections 1 and 2 are provided with heating means (not shown) for heating these mold sections 1 and 2 to a prescribed temperature.

The mold surface of the lower mold section 2 is provided with a necessary number of pots (not shown) to be supplied with a resin material, while plungers (not shown) for pressing the resin are engaged in the pots respectively.

Further, the lower mold section 2 is provided with a concave part 2a for supplying/setting a lead frame 6 provided with an electronic component 5, while a lower resin passage (not shown) is communicatively connected with the mold cavities 4 of the lower mold section 2.

On the other hand, the upper mold section 1 is provided with a cull part (not shown) for receiving the melted resin material transferred from the pots under pressure with the plungers and distributing the same into an upper resin passage.

When the upper and lower mold sections 1 and 2 are closed, the upper and lower resin passages are communicatively connected with each other, while the pots and the upper and lower mold cavities 3 and 4 communicate with the cull part through the upper and lower resin passages.

The resin material heated/melted in the mold pots are pressed with the plungers to be injected into and charged in the mold cavities 3 and 4 through the cull part and the upper and lower resin passages, so that a prescribed resin pressure can be applied thereto with the plungers.

Thus, the electronic component 5 engaged/set in the mold cavities 3 and 4 is sealed in a resin mold package 7 corresponding to the shapes of the mold cavities 3 and 4.

The upper and lower mold sections 1 and 2 are provided with pressing means for further pressing the resin received in the mold cavities 3 and 4 against surfaces of the lead frame 6 after the heated/melted resin material is injected into and charged in the mold cavities 3 and 4 and the prescribed resin pressure is applied to the resin received in the mold cavities 3 and 4, thereby improving adhesion between the resin mold package 7 molded in the mold cavities 3 and 4 and the lead frame 6.

The pressing means are structured as follows:

The upper mold section 1 is provided with a necessary number of air holes 8 of necessary shapes communicating with inner bottom surfaces of the upper mold cavities 3 while the air holes 8 are communicatively connected with an air compression source 10 such as a compressor through a necessary air passage 9, so that the air compression source 10 feeds compressed air into the upper mold cavities 3 under pressure through the air passage 9 and the air holes 8.

Thus, the resin received in the upper mold cavities 3 can be pressed against the upper surface of the lead frame 6 with the compressed air (see FIG. 2).

Similarly to the upper mold section 1, the lower mold section 2 is provided with a necessary number of air holes 12 of necessary shapes communicating with inner bottom surfaces of the lower mold cavities 4 while the air holes 12 are communicatively connected with an air compression source 10 such as a compressor through a necessary air passage 9, so that the air compression source 10 feeds compressed air into the lower mold cavities 4 under pressure through the air passage 9 and the air holes 12.

Thus, the resin received in the lower mold cavities 4 can be pressed against the lower surface of the lead frame 6 with the compressed air (see FIG. 2).

Switching pins (valve pins) 11 are engaged in the air holes 8 of the upper mold section 1 for opening/closing the air holes 8, while switching pins 13 are engaged in the air holes 12 of the lower mold section 2 for opening/closing the air holes 12. The switching pins 11 and 13 of the upper and lower mold sections 1 and 2 are vertically movable by proper vertical driving mechanisms (not shown) respectively.

When the vertical driving mechanisms move forward end surfaces of the switching pins 11 and 13 of the upper and lower mold sections 1 and 2 to positions substantially flush with the inner bottom surfaces of the upper and lower mold cavities 3 and 4 respectively, the air holes 8 and 12 can be reliably blocked with forward end portions 11a and 13a of the switching pins 11 and 13 respectively.

In this case, the upper and lower mold cavities 3 and 4 have the same functions and structures as general mold cavities while these cavities 3 and 4 are reliably cut off from the air compression sources 10 by the forward end portions 11a and 13a of the switching pins 11 and 13, whereby the compressed air can be prevented from flowing into the upper and lower mold cavities 3 and 4 respectively.

While the forward end portions 11a and 13a of the switching pins 11 and 13 are provided to be closely engaged with communication holes 8a and 12a between the air holes 8 and 12 and the upper and lower mold cavities 3 and 4 respectively, the switching pins 11 and 13 themselves are provided to be loosely engaged with the air holes 8 and 12 respectively.

When the vertical driving mechanisms move the switching pins 11 and 13 oppositely to the upper and lower mold cavities 3 and 4 respectively, on the other hand, the air holes 8 and 12 (the communication holes 8a and 12a) are released from the states blocked with the forward end portions 11a and 13a of the switching pins 11 and 13 respectively, so that the air holes 8 and 12 can be opened respectively.

Namely, the upper mold cavities 3 are communicatively connected with the air compression source 10 through the air holes 8, so that compressed air is fed into the upper mold cavities 3 under pressure through the air holes 8 (the communication holes 8a). Referring to FIG. 2, the compressed air is downwardly fed under pressure from the inner bottom surfaces of the upper mold cavities 3.

Thus, the resin received in the upper mold cavities 3 can be pressed against the upper surface of the lead frame 6 with pressing force by the compressed air, thereby improving the adhesion between (the upper portion of) the resin mold package 7 molded in the upper mold cavities 3, the upper surface of the lead frame 6 and the electronic component 5.

On the other hand, the lower mold cavities 4 are communicatively connected with the air compression source 10 through the air holes 12, so that compressed air is fed into the lower mold cavities 4 under pressure through the air holes 12 (the communication holes 12a). Referring to FIG. 2, the compressed air is upwardly fed under pressure from the inner bottom surfaces of the lower mold cavities 4.

Thus, the resin received in the lower mold cavities 4 can be pressed against the lower surface of the lead frame 6 with pressing force by the compressed air, thereby improving the adhesion between (the lower portion of) the resin mold package 7 molded in the lower mold cavities 4 and the lower surface of the lead frame 6.

As shown in FIGS. 1 and 2, the air holes 8 and the switching pins 11 are regularly closely engaged with each other to be cut off from the exterior on the sides of the air holes 8 opposite to the upper mold cavities 3.

Similarly, the air holes 12 and the switching pins 13 are regularly closely engaged with each other to be cut off from the exterior on the sides of the air holes 12 opposite to the lower mold cavities 4.

After the resin received in the upper and lower mold cavities 3 and 4 is hardened, the forward end portions 11a and 13a of the switching pins 11 and 13 are projected into the upper and lower mold cavities 3 and 4 respectively, whereby the resin mold package 7 molded in the mold cavities 3 and 4 can be released from the same. In this case, the switching pins 11 and 13 have mold releasing actions for serving as the so-called ejector pins respectively.

Thus, the aforementioned mold assembly for resin sealing generally seals the electronic component 5 with molded resin in the following manner:

The fixed upper mold section 1 and the movable lower mold section 2 of the mold assembly are previously heated with the heating means to a resin molding temperature, and these mold sections 1 and 2 are opened.

Then, the lead frame 6 provided with the electronic component 5 is supplied to/set on a prescribed position of the mold surface of the lower mold section 2, and the resin material is supplied into the pots of the lower mold section 2.

Then, the lower mold section 2 is upwardly moved, thereby closing the upper and lower mold sections 1 and 2. At this time, the electronic component 5 and the lead frame 6 around the same are engaged and set in the upper and lower mold cavities 3 and 4 which are provided on the mold surfaces of the upper and lower mold sections 1 and 2 to be opposed to each other.

Then, the resin material heated/melted in the pots is pressed with the plungers, so that the heated/melted resin material is injected into and charged in the upper and lower mold cavities 3 and 4 through the cull part and the upper and lower resin passages.

At this time, a prescribed resin pressure can be applied to the resin charged in the mold cavities 3 and 4 with the plungers.

After the prescribed resin pressure is applied to the resin charged in the mold cavities 3 and 4, the resin received in the mold cavities 3 and 4 is further pressed with the pressing means.

Namely, the switching pins 11 and 13 are moved to open the air holes 8 and 13 on the inner bottom surfaces of the mold cavities 3 and 4 respectively, while compressed air is fed into the mold cavities 3 and 4 under pressure from the air compression sources 10, for pressing the resin in the mold cavities 3 and 4 against the surfaces of the lead frame 6.

Thus, the resin received in the mold cavities 3 and 4 can be pressed against the surfaces of the lead frame 6, whereby the adhesion between the resin mold package 7 molded in the mold cavities 3 and 4, the lead frame 6 and the electronic component 5 can be improved.

After a lapse of a necessary time for hardening the melted resin material, the upper and lower mold sections 1 and 2 are opened, while the resin mold package 7 and the lead frame 6 can be released from the mold cavities 3 and 4 by the switching pins (ejector pins) 11 and 13 provided on the mold sections 1 and 2 respectively.

In the mold assembly shown in FIGS. 1 and 2, the pressure for closing the fixed upper mold section 1 and the movable lower mold section 2 is set in two stages of prescribed low and high closing pressures, for pressing the resin in the mold cavities 3 and 4 and improving the adhesion between the resin mold package 7, the lead frame 6 and the electronic component 5.

Namely, the upper and lower mold sections 1 and 2 are closed with the prescribed low closing pressure, and the electronic component 5 mounted on the lead frame 6 is engaged/set in the mold cavities 3 and 4.

Then, the resin material heated/melted in the pots of the lower mold section 2 is pressed with the plungers, so that the melted resin material is injected into and charged in the upper and lower mold cavities 3 and 4 through the cull part and the upper and lower resin passages.

Then, the prescribed resin pressure is applied to the resin received in the upper and lower mold cavities 3 and 4, and the upper and lower mold sections 1 and 2 are thereafter further closed with the prescribed high closing pressure.

Namely, the upper and lower mold sections 1 and 2 closed with the prescribed low closing pressure is further closed with the prescribed high closing pressure, whereby the pressure can be applied to the resin received in the mold cavities 3 and 4 while the resin can be pressed against the surfaces of the lead frame 6.

Thus, the adhesion between the resin mold package 7 molded in the upper and lower mold cavities 3 and 4, the lead frame 6 and the electronic component 5 can be improved.

Figure 3:
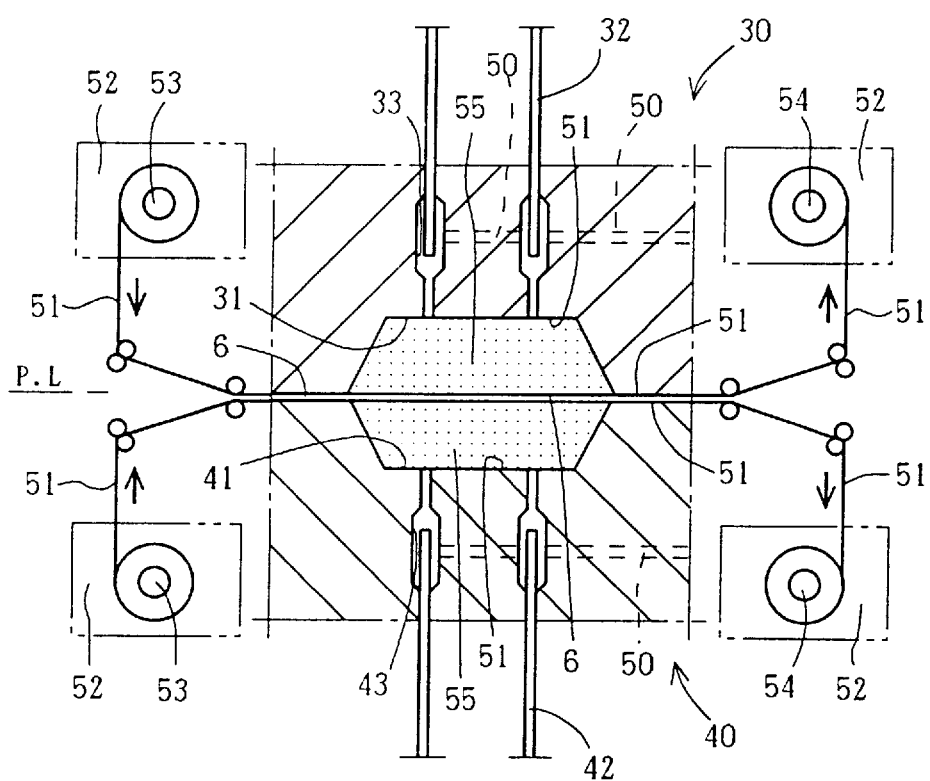
FIG. 3 is a schematic longitudinal sectional view showing a principal part of a mold assembly for resin sealing for carrying out the method according to the present invention, illustrating a state of feeding compressed air to mold releasing films covering inner surfaces of mold cavities of the mold assembly along the shapes thereof under pressure while pressing resin through the mold releasing films.

A mold assembly for resin sealing shown in FIG. 3 is now described.

The basic structure of the mold assembly shown in FIG. 3 is identical to that of the mold assembly shown in FIGS. 1 and 2.

Namely, the mold assembly shown in FIG. 3 is provided with a fixed upper mold section 30 and a movable lower mold section 40 which is opposed to the fixed upper mold section 30.

Similarly to the embodiment shown in FIGS. 1 and 2, the upper and lower mold sections 30 and 40 are provided on mold surfaces thereof with upper and lower mold cavities 31 and 41 for molding resin, so that an electronic component mounted on a lead frame 6 can be engaged and set in the upper and lower mold cavities 31 and 41 when the upper and lower mold sections 30 and 40 are closed.

The mold assembly shown in FIG. 3 is further provided with pressing means for pressing resin received in the upper and lower mold cavities 31 and 41, similarly to the embodiment shown in FIGS. 1 and 2.

Namely, the upper and lower mold cavities 31 and 41 are provided on inner bottom surfaces thereof with necessary numbers of air holes 33 and 43 respectively while switching pins 32 and 42 are engaged in the air holes 33 and 43 for opening/closing the same respectively, similarly to the embodiment shown in FIGS. 1 and 2. The air holes 33 and 43 are communicatively connected with air compression sources (not shown) through necessary air passages 50 respectively, so that the switching pins 32 and 42 are moved to open the air holes 33 and 43 respectively, thereby feeding compressed air into the upper and lower mold cavities 31 and 41 under pressure.

The mold assembly shown in FIG. 3 is provided with mold releasing film supply mechanisms 52 for supplying mold releasing films 51 for preventing resin contact to the mold surfaces of the upper and lower mold sections 30 and 40 respectively. The mold releasing film supply mechanisms 52 are formed by mold releasing film delivery parts 53, mold releasing film take-up parts 54 and the like, so that the mold releasing films 51 stored in the mold releasing film delivery parts 53 are controlled by control mechanisms (not shown) and automatically supplied between the mold surfaces of the upper and lower mold sections 30 and 40 respectively.

After the electronic component is sealed with resin by the upper and lower mold sections 30 and 40, the mold releasing films 51 supplied between the mold surfaces are automatically taken up by the mold releasing film take-up parts 54.

The mold releasing films 51 are supplied in proximity to each other in states extended along the mold surfaces of the upper and lower mold sections 30 and 40 respectively.

The mold releasing films 51, which are long film members supplied at least to the surfaces of the mold cavities 31 and 41 on the mold surfaces of the upper and lower mold sections 30 and 40 respectively, may comprise heat resistance capable of withstanding the resin molding temperature of about 175° C., for example, flexibility capable of being elastically deformed for preventing damages in resin molding, and resin unadhesiveness (separability) capable of being separated from the resin mold package 7 after molding.

In the mold assembly shown in FIG. 3, vacuum sources (not shown) such as vacuum pumps are communicatively connected with the air holes 33 and 34 through switching valves (not shown) provided on the air passages 50, while the mold assembly is provided with structures of switching the switching valves and forcibly sucking/discharging air etc. from the upper and lower mold cavities 31 and 41 by evacuating (decompressing) the same through the air holes 33 and 43 and the air passages 50, i.e., forced evacuation mechanisms.

Before a melted resin material is injected into and charged in the upper and lower mold cavities 31 and 41, the mold cavities 31 and 41 are evacuated through the air holes 33 and 43 provided on the inner bottom surfaces thereof, whereby the mold releasing films 51 supplied between the mold surfaces of the upper and lower mold sections 30 and 40 can be extended in states covering the inner surfaces of the upper and lower mold cavities 31 and 41 along the shapes thereof by the suction force, to be elastically deformed.

Similarly to the upper and lower mold cavities 31 and 41, the upper and lower mold sections 30 and 40 may be provided with forced evacuation mechanisms such as the air passages 50 on necessary portions of the mold surfaces.

Namely, the mold releasing films 51 can be extended in states covering the mold surfaces along irregular shapes (e.g., a cull part and upper and lower resin passages) thereof with the forced evacuation mechanisms, to be elastically deformed.

Thus, the mold assembly for resin molding shown in FIG. 3 seals the electronic component with molded resin as follows:

When the upper and lower mold sections 30 and 40 are opened, the mold releasing films 51 are supplied to the mold surfaces respectively while the lead frame 6 provided with the electronic component is supplied between the mold releasing films 51, i.e., between the upper and lower mold surfaces, so that the mold sections 30 and 40 are closed and the electronic component is engaged and set in the upper and lower mold cavities 31 and 41.

Then, the mold releasing films 51 are elastically deformed along the shapes of the upper and lower mold cavities 31 and 41 by the forced evacuation mechanisms respectively.

Then, a heated/melted resin material is injected into and charged in the upper and lower mold cavities 31 and 41 with plungers through the cull part provided on the upper mold section 30 and the upper and lower resin passages, while a prescribed resin pressure is applied to the resin received in the upper and lower mold cavities 31 and 41 with the plungers.

Thus, a resin mold package 55 can be molded in the upper and lower mold cavities 31 and 41 in correspondence to the shapes thereof, so that the electronic component mounted on the lead frame 6 can be sealed in the resin mold package 55.

Then, a prescribed resin pressure is applied to the resin received in the upper and lower mold cavities 31 and 41, i.e., between the mold releasing films 51, and the resin is thereafter further pressed by the pressing means through the mold releasing films 51.

Namely, the switching pins 32 and 42 are moved to open the air holes 33 and 43 in the inner bottom surfaces of the upper and lower mold cavities 31 and 41 respectively, while compressed air is fed to the upper and lower mold cavities 31 and 41 under pressure from the air compression sources for pressing the mold releasing films 51 with the compressed air, thereby pressing the resin received in the upper and lower mold cavities 31 and 41 against surfaces of the lead frame 6 from the exterior through the mold releasing films 51.

Thus, adhesion between the resin mold package 55 molded in the upper and lower mold cavities 31 and 41, the lead frame 6 and the electronic component can be improved.

Figure 4:
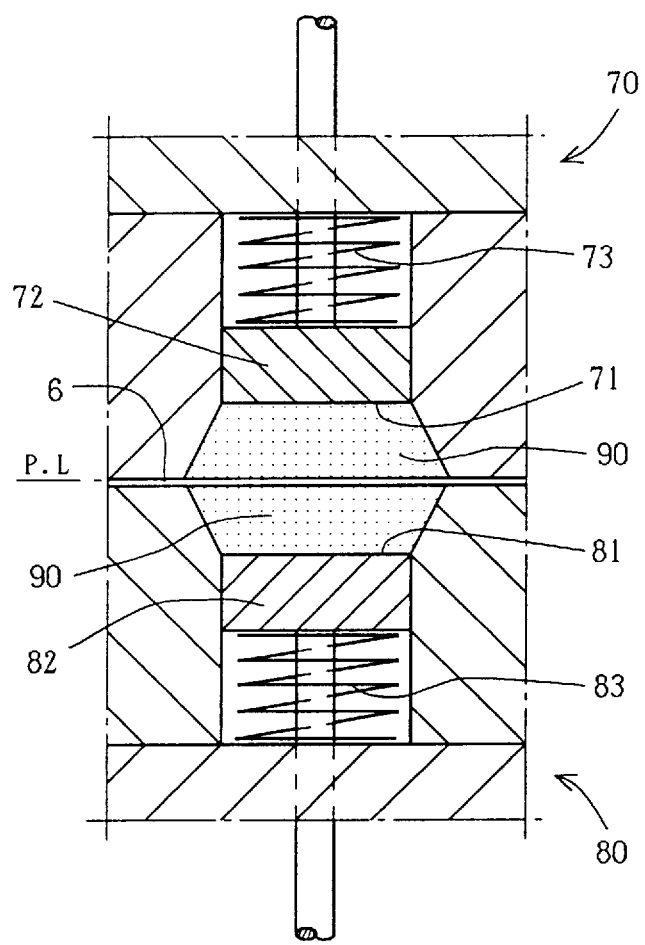
FIG. 4 is a schematic longitudinal sectional view showing a principal part of a mold assembly for resin sealing for carrying out the method according to the present invention, illustrating a state of pressing resin received in mold cavities of the mold assembly with pressing members provided on inner bottom surface portions of the mold cavities.

A mold assembly for resin sealing shown in FIG. 4 is now described.

The basic structure of the mold assembly shown in FIG. 4 is identical to that shown in FIGS. 1 and 2.

Similarly to the embodiment shown in FIGS. 1 and 2, the mold assembly shown in FIG. 4 is provided with a mold consisting of a fixed upper mold section 70 and a movable lower mold section 80 which is opposed to the fixed upper mold section 70, while upper and lower mold cavities 71 and 81 for molding resin are oppositely provided on mold surfaces of the upper and lower mold sections 70 and 80 respectively, so that an electronic component mounted on a lead frame 6 can be engaged and set in the upper and lower mold cavities 71 and 81 when the upper and lower mold sections 70 and 80 are closed.

Pressing members (pressing means) 72 and 82 are provided on inner bottom surface portions of the upper and lower mold cavities 71 and 81 for pressing resin received in the upper and lower mold cavities 71 and 81 respectively, while the pressing members 72 and 82 are provided with elastic members 73 and 83 such as springs for pressing the pressing members 72 and 82 toward the mold surfaces, so that a prescribed resin pressure is applied to the resin received in the upper and lower mold cavities 71 and 81 and the pressing members 72 and 82, i.e., the bottom surfaces of the upper and lower mold cavities 71 and 81, thereafter press the resin in the upper and lower mold cavities 71 and 81 respectively.

In the mold assembly shown in FIG. 4, a resin material heated/melted in pots of the mold is pressed with plungers to be injected into and charged in the mold cavities 71 and 81, so that a prescribed resin pressure is applied to the resin charged in the mold cavities 71 and 81 and the resin is thereafter pressed with the pressing members 72 and 82 in the mold cavities 71 and 81, to be pressed against surfaces of the lead frame 6 from the exterior.

Thus, adhesion between a resin mold package 90 molded in the upper and lower mold cavities 71 and 81, the lead frame 6 and the electronic component can be improved.

Figure 5:
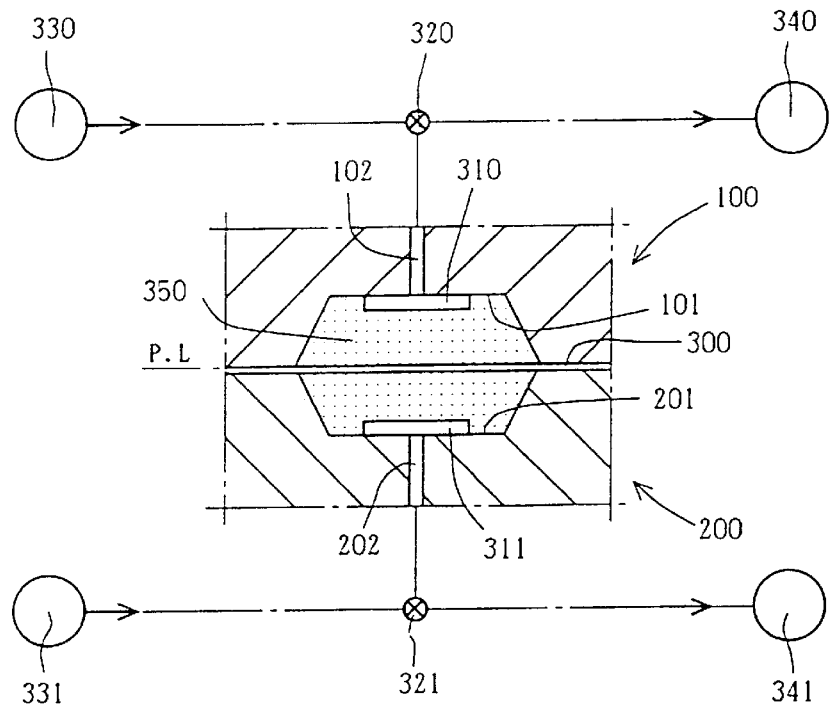
FIG. 5 is a schematic longitudinal sectional view showing a principal part of a mold assembly for resin sealing for carrying out the method according to the present invention, illustrating a state of feeding compressed air to heat radiating plates fixed to bottom surface portions of mold cavities of the mold assembly under pressure while pressing resin through the heat radiating plates.

A mold assembly for resin sealing shown in FIG. 5 is now described.

The basic structure of the mold assembly shown in FIG. 5 is identical to that shown in FIGS. 1 and 2.

Similarly to the embodiment shown in FIGS. 1 and 2, the mold assembly shown in FIG. 5 is provided with a mold consisting of a fixed upper mold section 100 and a movable lower mold section 200 which is opposed to the fixed upper mold section 100, while upper and lower mold cavities 101 and 201 for molding resin are oppositely provided on mold surfaces of the upper and lower mold sections 100 and 200 respectively.

An electronic component (not shown) mounted on a lead frame 300 can be engaged and set in the upper and lower mold cavities 101 and 201, while heat radiating plates 310 and 311 can be fixed to and set on inner bottom surfaces of the upper and lower mold cavities 101 and 201 respectively.

The inner bottom surfaces of the upper and lower mold cavities 101 and 201 are provided with necessary numbers of air passages 102 and 202 communicating with the mold cavities 101 and 201 respectively, while the air passages 102 and 202 are connected with air compression sources 330 and 331 for feeding compressed air under pressure through switching valves 320 and 321 and vacuum sources 340 and 341 for forcibly sucking/discharging (decompressing) air etc. from the upper and lower mold cavities 101 and 201 respectively.

In the mold assembly shown in FIG. 5, the electronic component mounted on the lead frame 300 and the heat radiating plates 310 and 311 are set in the upper and lower mold cavities 101 and 201 of the upper and lower mold sections 100 and 200 respectively, and the upper and lower mold sections 100 and 200 are closed.

At this time, the heat radiating plates 310 and 311 are fixed to and set on the inner bottom surfaces of the upper and lower mold cavities 101 and 201 through the suction force of the vacuum sources 340 and 341 respectively.

Then, a resin material heated/melted in pots (not shown) provided on the lower mold section 200 is pressed with plungers, and injected into and charged in the upper and lower mold cavities 101 and 201 through a cull part of the upper mold section 100 and upper and lower resin passages.

Then, a prescribed resin pressure is applied to the resin received in the upper and lower mold cavities 101 and 201, and the switching valves 320 and 321 are thereafter switched for feeding compressed air into the upper and lower mold cavities 101 and 201 under pressure from the air compression sources 330 and 331 respectively, thereby pressurizing the heat radiating plates 310 and 311 in the mold cavities 101 and 201 and pressing the resin received in the upper and lower mold cavities 101 and 201 against surfaces of the lead frame 300 through the heat radiating plates 310 and 311 respectively.

Thus, adhesion between a resin mold package 350 molded in the upper and lower mold cavities 101 and 201, the lead frame 300 and the electronic component can be improved.

Figure 6:
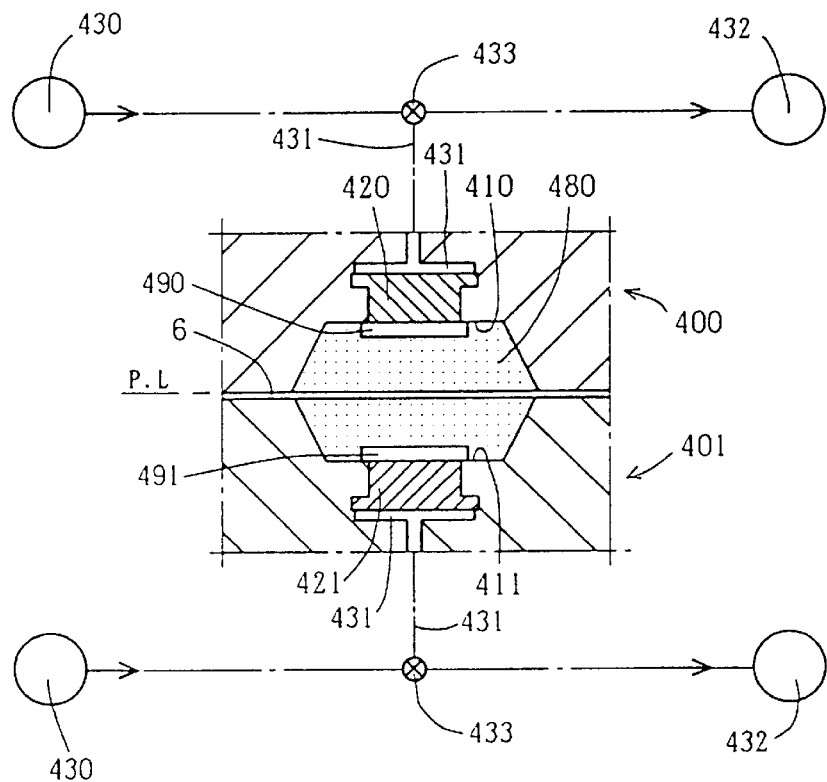
FIG. 6 is a schematic longitudinal sectional view showing a principal part of a mold assembly for resin sealing for carrying out the method according to the present invention, illustrating a state of feeding compressed air to heat radiating plates fixed to bottom surface portions of cavities in the mold assembly under pressure while feeding compressed air to the heat radiating plates through continuous pores of cavity bottom surface members, prepared from porous materials, provided on the mold assembly under pressure thereby pressing resin received in the mold cavities through the heat radiating plates.

A mold assembly for resin sealing shown in FIG. 6 is now described.

The basic structure of the mold assembly shown in FIG. 6 is identical to the structure shown in FIGS. 1 and 2.

Similarly to the embodiment shown in FIGS. 1 and 2, the mold assembly shown in FIG. 6 is provided with a mold consisting of a fixed upper mold section 400 and a movable lower mold section 401 which is opposed to the fixed upper mold section 400, while upper and lower mold cavities 410 and 411 for molding resin are oppositely provided on mold surfaces of the upper and lower mold sections 400 and 401 respectively.

An electronic component (not shown) mounted on a lead frame 6 can be engaged and set in the upper and lower mold cavities 410 and 411 when the upper and lower mold sections 400 and 401 are closed, while heat radiating plates 490 and 491 can be fixed to and set on inner bottom surfaces of the upper and lower cavities 410 and 411 respectively.

As shown in FIG. 6, the upper and lower mold cavities 410 and 411 are provided on bottom surface portions thereof with upper and lower cavity bottom surface members 420 and 421 which are prepared from porous materials respectively. The porous materials have numbers of fine continuous pores (not shown) having air permeability as described later. Thus, the upper and lower cavity bottom surface members 420 and 421 prepared from the porous materials can readily pass gas such as air.

Further, the mold assembly shown in FIG. 6 is provided with forced evacuation mechanisms (vacuum sources) 432 for forcibly sucking/discharging (decompressing) air or the like from the upper and lower mold cavities 410 and 411, while the forced evacuation mechanisms 432 are communicatively connected with surfaces, e.g., those opposite to the surfaces provided with the upper and lower mold cavities 410 and 411, of the upper and lower mold cavity bottom surfaces members 420 and 421 through switching valves 433 and air passages 431 respectively.

The mold assembly shown in FIG. 6 is further provided with air compression sources 430 such as compressors for feeding compressed air or the like under pressure, and these air compression sources 430 are communicatively connected with surfaces, e.g., those opposite to the surfaces provided with the upper and lower mold cavities 410 and 411, of the upper and lower mold cavity bottom surfaces members 420 and 421 through the switching valves 433 and the air passages 431 respectively.

On the side of the upper mold section 400 (or the lower mold section 401), the air compression source 430 and the forced evacuation mechanism 432 are so formed that functions thereof can be switched through the switching valve 433, while the switching valve 433 connecting the air compression source 430 and the forced evacuation mechanism 432 with each other and the upper mold cavities 410 (or the lower mold cavities 411) are communicatively connected with each other through the continuous pores provided on the upper cavity bottom surface members 420 (or the lower cavity bottom surface members 421) prepared from the aforementioned porous materials and the air passages 431.

Therefore, the heat radiating plates 490 and 491 can be fixed to and set on the inner bottom surfaces of the upper and lower mold cavities 410 and 411 through suction force of the forced evacuation mechanisms 432 by evacuating the upper and lower mold cavities 410 and 411 by the forced evacuation mechanisms 432 through the continuous pores provided on the surfaces of the upper and lower cavity bottom surface members 420 and 421 closer to the bottom surfaces of the upper and lower mold cavities 410 and 411 respectively and the air passages 431.

Further, compressed air can be reliably fed into the upper and lower mold cavities 410 and 411 under pressure from the air compression sources 430 through the continuous pores provided on the surfaces of the upper and lower cavity bottom surface members 420 and 421 closer to the bottom surfaces of the upper and lower mold cavities 410 and 411 respectively while a pressure can be applied to the resin received in the upper and lower mold cavities 410 and 411 through the heat radiating plates 490 and 491 by switching the switching valves 433.

Similarly to each of the aforementioned embodiments, a melted resin material is injected into and charged in the upper and lower mold cavities 410 and 411, while the electronic component mounted on the lead frame 6 engaged and set in the upper and lower mold cavities 410 and 411 and the lead frame 6 around the same can be sealed in a resin mold package 480 molded in the upper and lower mold cavities 410 and 411 in correspondence to the shapes thereof.

In the embodiment shown in FIG. 6, structures of feeding compressed air into the upper and lower mold cavities 410 and 411 under pressure from the air compression sources 430 through the air passages 431 and the continuous pores of the upper and lower cavity bottom surface members 420 and 421 prepared from the porous materials thereby pressing the resin received in the upper and lower mold cavities 410 and 411 are provided as pressing means for pressing the resin received in the upper and lower mold cavities 410 and 411 through the heat radiating plates 490 and 491.

The aforementioned porous materials may be formed by porous metal materials or porous ceramic materials, for example.

For example, mold members prepared from the porous metal materials are molded in necessary shapes by storing powdered metals (or granulated metals) in necessary molds, e.g., molds capable molding the shapes of the upper and lower cavity bottom surface members 420 and 421, and compressing the powdered metals in the molds with necessary high pressures and sintering the same.

Thus, numbers of continuous pores having necessary pore sizes (diameters) can be arbitrarily formed between grains of the powdered metals by compressing the powdered metals with the necessary high pressures and firing the same thereby properly filling up clearances between the grains.

In the mold assembly shown in FIG. 6, the electronic component mounted on the lead frame 6 is engaged and set in the upper and lower mold cavities 410 and 411 of the upper and lower mold sections 400 and 401, the heat radiating plates 490 and 491 are fixed to and set on the bottom surfaces of the upper and lower mold cavities 410 and 411 by the forced evacuation mechanisms 432, and the resin material heated/melted in pots of the mold is pressed with plungers, to be injected into and charged in the mold cavities 410 and 411.

Then, a prescribed resin pressure is applied to the resin injected into and charged in the mold cavities 410 and 411, and compressed air is thereafter fed into the upper and lower mold cavities 410 and 411 under pressure from the air compression sources 430 through the air passages 431 and the numbers of continuous pores of the upper and lower mold cavities 420 and 421 by switching the switching valves 433, whereby the resin received in the upper and lower mold cavities 410 and 411 can be pressed against surfaces of the lead frame 6 from the exterior.

Thus, adhesion between the resin mold package 480 molded in the upper and lower mold cavities 410 and 411, the lead frame 6 and the electronic component can be improved.

Figure 7:
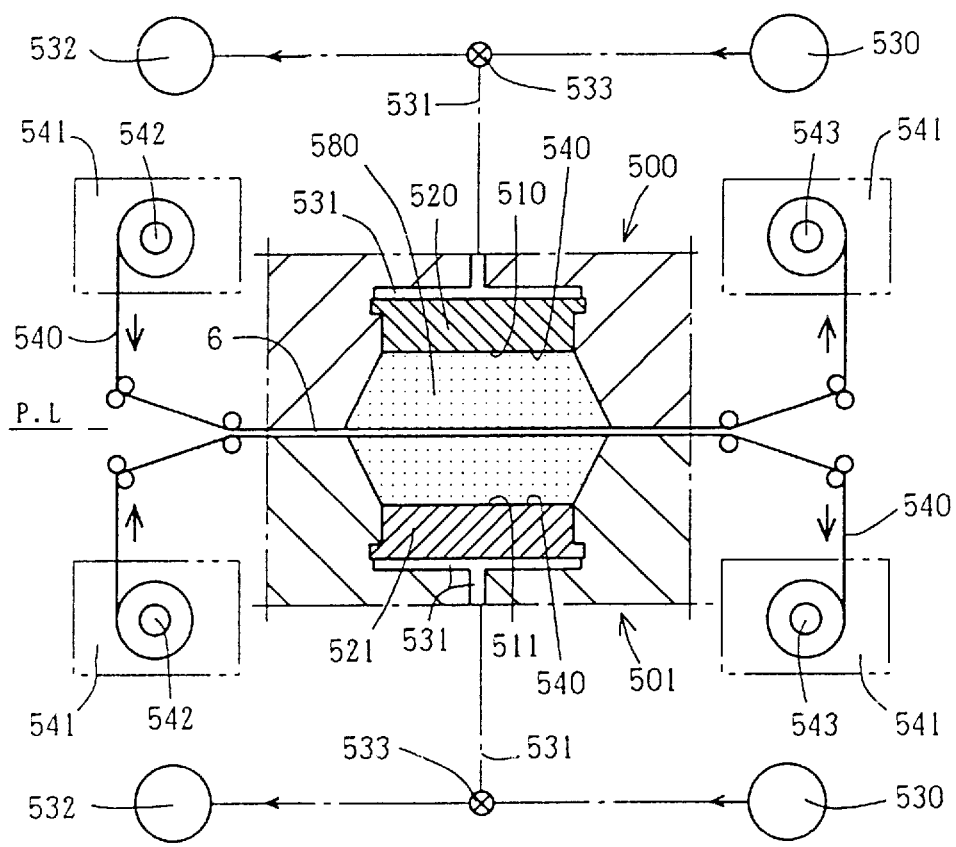
FIG. 7 is a schematic longitudinal sectional view showing a principal part of a mold assembly for resin sealing for carrying out the method according to the present invention, illustrating a state of feeding compressed air through continuous pores of cavity bottom surface members, prepared from porous materials, provided on the mold assembly under pressure thereby pressing resin received in the mold cavities through mold releasing films.

A mold assembly for resin sealing shown in FIG. 7 is now described.

The basic structure of the mold assembly shown in FIG. 7 is identical to the structure shown in FIGS. 1 and 2.

Similarly to the embodiment shown in FIG. 6, the mold assembly shown in FIG. 7 is provided with a mold consisting of a fixed upper mold section 500 and a movable lower mold section 501 which is opposed to the fixed upper mold section 500, while upper and lower mold cavities 510 and 511 for molding resin are oppositely provided on mold surfaces of the upper and lower mold sections 500 and 501 respectively, so that an electronic component mounted on a lead frame 6 can be engaged and set in the mold cavities 510 and 511 when the upper and lower mold sections 500 and 501 are closed.

Referring to FIG. 7, the upper and lower mold cavities 510 and 511 are provided on bottom surfaces thereof with upper and lower cavity bottom surface members 520 and 521 which are prepared from the aforementioned porous materials respectively, while numbers of fine continuous pores (not shown) are formed on the upper and lower cavity bottom surface members 520 and 521 prepared from the porous materials, so that gas such as air can be passed through the continuous pores, similarly to the embodiment shown in FIG. 6.

Further similarly to the embodiment shown in FIG. 6, the mold assembly shown in FIG. 7 is provided with air compression sources 530 such as compressors for feeding compressed air or the like under pressure, while the air compression sources 530 are communicatively connected with surfaces, e.g., those opposite to the surfaces provided with the upper and lower mold cavities 510 and 511, of the upper and lower mold cavity bottom surfaces members 520 and 521 through air passages 531 respectively.

Switching valves 533 are provided on the air passages 531 on the sides of the air compression sources 530, while forced evacuation mechanisms 532 such as vacuum pumps (vacuum sources) having evacuation functions are connected with the switching valves 533.

In the mold assembly shown in FIG. 7, the air compression sources 530 and the forced evacuation mechanisms 532 are connected with the switching valves 533 independently of each other, to be communicatively connected with the air passages 531 independently of each other by being switched by the switching valves 533, while the inner sides of the upper and lower mold cavities 510 and 511 can be communicatively connected with the switching valves 533 (i.e., the air compression sources 530 and the forced evacuation mechanisms 532) through the continuous pores and the air passages 531.

Thus, the switching valves 533 are so switched as to evacuate the upper and lower mold cavities 510 and 511 by reliably forcibly sucking/discharging (decompressing) air or the like therefrom through the continuous pores provided on the sides of the upper and lower cavity bottom surface members 520 and 521 closer to the bottom surfaces of the upper and lower cavities 510 and 511 and the air passages 531 respectively, while reliably feeding compressed air or the like into the upper and lower mold cavities 510 and 511 under pressure from the air compression sources 530.

The mold assembly shown in FIG. 7 is further provided with structures utilizing mold releasing films for preventing resin contact, similarly to the embodiment shown in FIG. 3.

In the mold assembly shown in FIG. 7, the basic structures of mold releasing film supply mechanisms and the like are identical to those of the embodiment shown in FIG. 3.

Further, the structures of the mold releasing films for preventing resin contact shown in FIG. 7 are identical to those of the mold releasing films utilized in the embodiment shown in FIG. 3.

Namely, the mold assembly shown in FIG. 7 is provided with mold releasing film supply mechanisms 541 for supplying mold releasing films 540 for preventing resin contact to mold surfaces of the upper and lower mold sections 500 and 510 respectively, while the mold releasing film supply mechanisms 541 are formed by mold releasing film delivery parts 542, mold releasing film take-up parts 543 and the like, so that the mold releasing films 540 stored in the mold releasing film delivery parts 542 are controlled by control mechanisms (not shown) and automatically supplied between the mold surfaces of the upper and lower mold sections 500 and 501 respectively.

After the electronic component is sealed with the molded resin by the upper and lower mold sections 500 and 501, the mold releasing films 540 supplied between the mold surfaces are automatically taken up by the mold releasing film take-up parts 543.

Similarly to the embodiment shown in FIG. 3, the mold releasing films 540 are long film members which are supplied at least to the surfaces of the mold cavities 510 and 511 on the mold surfaces of the upper and lower mold sections 500 and 501 respectively, and supplied in proximity to each other in states extended along the mold surfaces of the upper and lower mold sections 500 and 501 respectively.

The mold assembly shown in FIG. 7 is provided with the forced evacuation mechanisms 532, which forcibly suck/discharge air through the numbers of fine continuous pores provided on the upper and lower cavity bottom surface members 520 and 521 prepared from the porous materials, i.e., the bottom surfaces of the upper and lower mold cavities 510 and 511, thereby extending the mold releasing films 540 supplied between the mold surfaces of the upper and lower mold sections 500 and 501 along the shapes of the upper and lower mold cavities 510 and 511 for elastically deforming the same.

In the mold assembly shown in FIG. 7, a melted resin material is injected into and charged in the upper and lower mold cavities 510 and 511 whose inner surfaces are covered with the extended mold releasing films 540 similarly to each of the aforementioned embodiments, so that the electronic component mounted on the lead frame 6 and the lead frame 6 around the same can be sealed in a resin mold package 580 molded in the upper and lower mold cavities 510 and 511 in correspondence to the shapes thereof.

Similarly to the embodiment shown in FIG. 6, pressing means for pressing the resin received in the upper and lower mold cavities 510 and 511 are formed by structures of feeding compressed air from the air compression sources 530 into the upper and lower mold cavities 510 and 511 under pressure through the upper and lower mold cavity bottom surface members 520 and 521 prepared from the porous materials.

Namely, the electronic component mounted on the lead frame 6 is first engaged and set in the upper and lower mold cavities 510 and 511 in the mold assembly shown in FIG. 7, and the upper and lower mold cavities 510 and 511 are evacuated through the continuous pores of the upper and lower cavity bottom surface members 520 and 521 prepared from the porous materials with the forced evacuation mechanisms 532, thereby extending the mold releasing films 540 to cover the inner surfaces of the upper and lower mold cavities 510 and 511 along the shapes thereof by sucking actions.

Then, the melted resin material is injected into and charged in the upper and lower mold cavities 510 and 511 whose inner surfaces are covered with the extended mold releasing films 540, a prescribed resin pressure is applied to the resin charged in the upper and lower mold cavities 510, and compressed air is thereafter fed under pressure from the air compression sources 530 through the continuous pores, thereby pressing the resin received in the upper and lower mold cavities 510 and 511 through the mold releasing films 540 by pressing actions thereof and pressing the resin against surfaces of the lead frame 6 from the exterior.

Thus, adhesion between the resin mold package 580 molded in the upper and lower mold cavities 510 and 511, the lead frame 6 and the electronic component can be improved.

The resin received in the upper and lower mold cavities 510 and 511 can be homogeneously pressed through the mold releasing films 540.

In each of the embodiments shown in FIGS. 6 and 7, mold members, such as cavity blocks, for example, comprising at least the overall upper and lower mold cavities 410 and 411 or 510 and 511 can be prepared from the aforementioned porous materials, similarly to the upper and lower cavity bottom surface members 420 and 421 or 520 and 521 provided on the bottom surfaces of the upper and lower mold cavities 410 and 411 or 510 and 511.

In this case, compressed air can be reliably fed into the upper and lower mold cavities 410 and 411 or 510 and 511 while the upper and lower mold cavities 410 and 411 or 510 and 511 can be reliably evacuated through the continuous pores provided on the overall inner surfaces of the upper and lower mold cavities 410 and 411 or 510 and 511 in the mold members comprising the upper and lower mold cavities 410 and 411 or 510 and 511 prepared from the porous materials.

In the embodiment shown in FIG. 6, therefore, the resin received in the upper and lower mold cavities 410 and 411 can be pressed against the surfaces of the lead frame 6 from the exterior by feeding compressed air under pressure through the continuous pores of the mold members comprising the upper and lower mold cavities 410 and 411 prepared from the porous materials.

In the embodiment shown in FIG. 7, on the other hand, the mold releasing films 540 can be extended to cover the inner surfaces of the upper and lower mold cavities 510 and 511 along the shaped thereof by the sucking actions of evacuating the same through the continuous pores provided on the upper and lower mold cavities 510 and 511 prepared from the porous materials, while the resin received in the upper and lower mold cavities 510 and 511 can be pressed against the surfaces of the lead frame 6 from the exterior by feeding compressed air under pressure through the continuous pores of the mold members comprising the upper and lower mold cavities 510 and 511 prepared from the porous materials.

In the embodiment shown in FIG. 7, further, mold members such as cull parts, resin passages or the like, for example, having surfaces (concave portions) which come into contact with the melted resin material received between the mold surfaces of the upper and lower mold sections 500 and 501 can be prepared from the porous materials, so that the upper and lower mold cavities 510 and 511 can be evacuated through the continuous pores of the mold members prepared from the porous materials with the forced evacuation mechanisms 532.

Thus, the mold releasing films 540 can be extended to cover the mold surfaces along the shapes (concave portions) thereof by the sucking actions of the forced evacuation mechanisms 532, to be elastically deformed.

Figure 8:
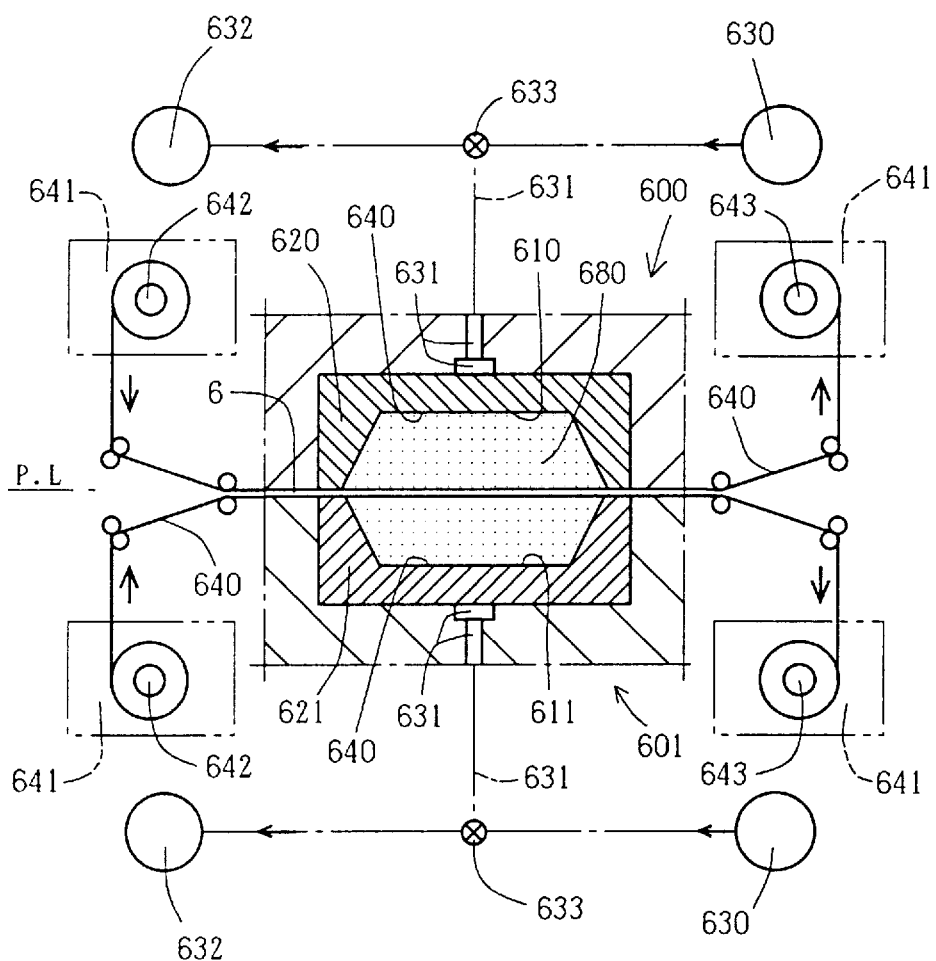
FIG. 8 is a schematic longitudinal sectional view showing a principal part of a mold assembly for resin sealing for carrying out the method according to the present invention, illustrating a state of feeding compressed air to mold releasing films through continuous pores of porous materials forming cavity members defining overall mold cavities under pressure thereby pressing resin received in the mold cavities through the mold releasing films.

A mold assembly for resin sealing shown in FIG. 8 is now described.

The basic structure of the mold assembly shown in FIG. 8 is identical to the structure shown in FIGS. 1 and 2.

Similarly to the embodiment shown in FIGS. 1 and 2, the mold assembly shown in FIG. 7 is provided with a mold consisting of a fixed upper mold section 600 and a movable lower mold section 601 which is opposed to the fixed upper mold section 600, while upper and lower mold cavities 610 and 611 for molding resin are oppositely provided on mold surfaces of the upper and lower mold sections 600 and 601 respectively, so that an electronic component mounted on a lead frame 6 can be engaged and set in the mold cavities 610 and 611 when the upper and lower mold sections 600 and 601 are closed.

In the embodiment shown in FIG. 8, structures utilizing mold releasing films 640 for preventing resin contact can be employed, similarly to the embodiments shown in FIGS. 3 and 7.

Further, mold members comprising at least the overall upper and lower mold cavities 610 and 611, i.e., upper and lower mold cavity members 620 and 621, are prepared from porous materials having air permeability respectively in the upper and lower mold sections 600 and 601 similarly to the embodiments shown in FIGS. 6 and 7, while numbers of continuous pores are provided on the upper and lower mold cavity members 620 and 621 prepared from the porous materials, so that gas such as air can be passed through the continuous pores.

Namely, the upper and lower mold cavity members 620 and 621 comprising at least the upper and lower mold cavities 610 and 611 are prepared from the porous materials, whereby the numbers of continuous pores are provided on the overall inner surfaces of the upper and lower mold cavities 610 and 611 respectively.

Alternatively, the overall upper and lower mold sections 600 and 601 may be prepared from the aforementioned porous materials, so that the numbers of continuous pores are provided on the overall inner surfaces of the upper and lower mold cavities 610 and 611.

Further, the mold assembly shown in FIG. 8 is provided with air compression sources 630 for feeding compressed air into the upper and lower mold cavities 610 and 611 under pressure, forced evacuation mechanisms 632 for evacuating the upper and lower mold cavities 610 and 611, and switching valves 633 for switching functions of the air compression sources 630 and the forced evacuation mechanism 632, similarly to the embodiments shown in FIGS. 6 and 7.

In addition, the upper and lower mold cavities 610 and 611 of the upper and lower mold cavity members 620 and 621 prepared from the porous materials, the air compression sources 630 and the forced evacuation mechanisms 632 are communicatively connected with each other through the numbers of continuous pores provided on the upper and lower mold cavity members 620 and 621, the air passages 631 and the switching valves 633.

The air compression sources 630 can reliably feed compressed air under pressure at least into the upper and lower mold cavities 610 and 611 through the numbers of continuous pores of the upper and lower mold cavity members 620 and 621 and the air passages 631, i.e., through the continuous pores provided on the overall inner surfaces of the upper and lower mold cavities 610 and 611.

The forced evacuation mechanisms 632 can reliably evacuate at least the upper and lower mold cavities 610 and 611 through the numbers of continuous pores of the upper and lower mold cavity members 620 and 621 and the air passages 631, i.e., through the continuous pores provided on the overall inner surfaces of the upper and lower mold cavities 610 and 611.

Similarly to the embodiments shown in FIGS. 3 and 7, the mold assembly shown in FIG. 8 is provided with mold releasing film supply mechanisms 641 for supplying mold releasing films 640 for preventing resin contact to mold surfaces of the upper and lower mold sections 600 and 601 respectively, while the mold releasing film supply mechanisms 640 are formed by mold releasing film delivery parts 642, mold releasing film take-up parts 643 and the like, so that mold releasing films 640 stored in the mold releasing film delivery parts 642 are controlled by control mechanisms (not shown) and automatically supplied between the mold surfaces of the upper and lower mold sections 600 and 601 respectively.

The mold assembly shown in FIG. 8 is provided with the forced evacuation mechanisms 632, which forcibly suck/discharge air through the numbers of fine continuous pores provided on the overall inner surfaces of the upper and lower mold cavities 610 and 611 prepared from the porous materials before a melted resin material is injected into and charged in the upper and lower mold cavities 610 and 611, thereby extending the mold releasing films 640 supplied between the mold surfaces of the upper and lower mold sections 600 and 601 to cover the same along the shapes of the upper and lower mold cavities 610 and 611 by suction force thereof, for elastically deforming the mold releasing films 640.

Similarly to each of the aforementioned embodiments, the melted resin material is injected into and charged in the upper and lower mold cavities 610 and 611 covered with the extended mold releasing films 640 in the mold assembly shown in FIG. 8, so that an electronic component mounted on a lead frame 6 and the lead frame 6 around the same can be sealed in a resin mold package 680 molded in the upper and lower mold cavities 610 and 611 in correspondence to the shapes thereof.

In the mold assembly shown in FIG. 8, pressing means for pressing the resin received in the upper and lower mold cavities 610 and 611 through the mold releasing films 640 are formed by structures of feeding compressed air to the mold releasing films 640 in the upper and lower mold cavities 610 and 611 under pressure from the air compression sources 630 through the air passages 631 and the continuous pores provided on the overall inner surfaces of the upper and lower mold cavities 610 and 611 of the upper and lower mold sections 600 and 601 prepared from the porous materials, similarly to the embodiment shown in FIG. 7.

In the mold assembly shown in FIG. 8, at least the upper and lower mold cavities 610 and 611 are reliably evacuated with forced evacuation mechanisms through the air passages 631 and the continuous pores of the upper and lower mold cavity members 620 and 621, thereby extending mold releasing films supplied between the mold surfaces of the upper and lower mold sections 600 and 601 to cover the inner surfaces of the upper and lower mold cavities 610 and 611 along the shapes thereof by suction force, and elastically deforming the mold releasing films.

Then, the melted resin material is injected into and charged in the upper and lower mold cavities 610 and 611 of the upper and lower mold cavity members 620 and 621 prepared from the porous materials, and a prescribed resin pressure is applied to the resin charged in the upper and lower mold cavities 610 and 611, so that the resin received in the upper and lower mold cavities 610 and 611 is pressed against surfaces of the lead frame 6 from the exterior through the mold releasing films by pressing actions of the air compression sources 630 feeding compressed air under pressure.

Thus, adhesion between the resin mold package 680 molded in the upper and lower mold cavities 610 and 611, the lead frame 6 and the electronic component can be improved.

The resin received in the upper and lower mold cavities 610 and 611 can be homogeneously pressed through the mold releasing films.

Figure 9:
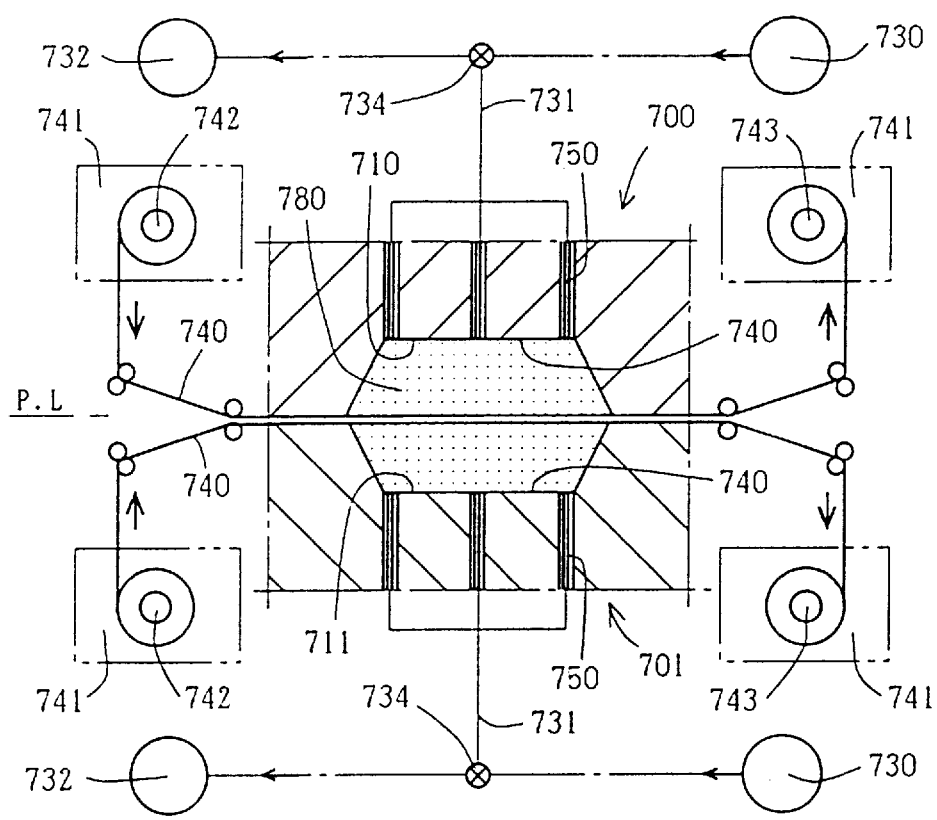
FIG. 9 is a schematic longitudinal sectional view showing a principal part of a mold assembly for carrying out the method according to the present invention, illustrating a state of feeding compressed air through converging tubes provided on bottom surfaces of mold cavities under pressure thereby pressing resin received in the mold cavities through mold releasing films.

A mold assembly for resin sealing shown in FIG. 9 is now described.

The basic structure of the mold assembly shown in FIG. 9 is identical to the structure shown in FIGS. 1 and 2.

Similarly to the embodiment shown in FIGS. 1 and 2, the mold assembly shown in FIG. 9 is provided with a mold consisting of a fixed upper mold section 700 and a movable lower mold section 701 which is opposed to the fixed upper mold section 700, while upper and lower mold cavities 710 and 711 for molding resin are oppositely provided on mold surfaces of the upper and lower mold sections 700 and 701 respectively, so that an electronic component mounted on a lead frame 6 can be engaged and set in the mold cavities 710 and 711 when the upper and lower mold sections 700 and 701 are closed.

The upper and lower mold cavities 710 and 711 are provided on bottom surfaces thereof with necessary numbers of converging tubes 750 each consisting of a number of tubes for passing gas such as air.

Similarly to the embodiments shown in FIGS. 3 and 7, the mold assembly shown in FIG. 9 is provided with air compression sources 730 for feeding compressed air under pressure, forced evacuation mechanisms 732 for evacuation, switching valves 734 connected with the air compression sources 730 and the forced evacuation mechanisms 732 independently of each other, and air passages 731 communicatively connected with the switching valves 734, so that the air compression sources 730 and 732 are communicatively connected with the air passages 731 independently of each other by switching the switching valves 734.

Further, the air compression sources 730 or the forced evacuation mechanisms 732 are communicatively connected with the upper and lower mold cavities 710 and 711 through the converging tubes 750 and the air passages 731 respectively.

Thus, the switching valves 734 are so switched that the air compression sources 730 can feed compressed air into the upper and lower mold cavities 710 and 711 under pressure, while the forced evacuation mechanisms 732 can evacuate (decompress) the upper and lower mold cavities 710 and 711.

The mold assembly shown in FIG. 9 is further provided with structures utilizing mold releasing films 740 for preventing resin contact, similarly to the embodiments shown in FIGS. 3 and 7.

Namely, the mold assembly shown in FIG. 9 is provided with mold releasing film supply mechanisms 741 for supplying mold releasing films 740 to the mold surfaces of the upper and lower mold sections 700 and 701 respectively. The mold releasing film supply mechanisms 741 are formed by mold releasing film delivery parts 742, mold releasing film take-up parts 743 and the like, so that the mold releasing films 740 stored in the mold releasing film delivery parts 742 are controlled by control mechanisms (not shown) and automatically supplied between the mold surfaces of the upper and lower mold sections 700 and 701 respectively.

After the electronic component is sealed with molded resin by the upper and lower mold sections 700 and 701, the mold releasing films 740 supplied between the mold surfaces are automatically taken up by the mold releasing film take-up parts 743 respectively.

Before a melted resin material is injected, the forced evacuation mechanism 532 evacuate the upper and lower mold cavities 710 and 711 through the converging tubes 750 provided on inner bottom surfaces thereof, for extending the mold releasing films 740 supplied between the mold surfaces of the upper and lower mold sections 700 and 701 by suction force thereby covering the mold surfaces along the shapes of the upper and lower mold cavities 710 and 711 to be elastically deformed.

In the mold assembly shown in FIG. 9, the melted resin material is injected into and charged in the upper and lower mold cavities 710 and 711 whose inner surfaces are covered with the extended mold releasing films 740, whereby the electronic component mounted on the lead frame 6 can be sealed in a resin mold package 780 molded in the upper and lower mold cavities 710 and 711 in correspondence to the shapes thereof, similarly to the aforementioned embodiments.

Further, pressing means for pressing the resin received in the upper and lower mold cavities 710 and 711 are formed by structures of pressing the resin through the mold releasing films 740 by feeding compressed air under pressure into the upper and lower mold cavities 710 and 711 through the converging tubes 750 provided on the bottom surfaces of the upper and lower mold cavities 710 and 711 respectively.

In the mold assembly shown in FIG. 9, the electronic component mounted on the lead frame 6 is first engaged and set in the upper and lower mold cavities 710 and 711, and the forced evacuation mechanisms 732 forcibly suck/discharge air etc. from the upper and lower mold cavities 710 and 711 with sucking actions thereof through the converging tubes 750 provided on the bottom surfaces of the upper and lower mold cavities 710 and 711, thereby extending the mold releasing films 740 to cover the inner surfaces of the upper and lower mold cavities 710 and 711 along the shapes thereof.

Then, the melted resin material is charged in the upper and lower mold cavities 710 and 711 whose inner surfaces are covered with the extended mold releasing films 710 and 711, a prescribed resin pressure is applied to the resin charged in the upper and lower mold cavities 710 and 711, and compressed air is thereafter fed from the air compression sources 730 through the converging tubes 750 thereby pressing the resin received in the upper and lower mold cavities 710 and 711 through the mold releasing films 740 by pressing actions thereof, for pressing the resin received in the upper and lower mold cavities 710 and 711 against surfaces of the lead frame 6 from the exterior.

Thus, adhesion between the resin mold package 780 molded in the upper and lower mold cavities 710, the lead frame 6 and the electronic component can be improved.

The resin received in the upper and lower mold cavities 710 and 711 can be homogeneously pressed through the mold releasing films 740.

In each of the aforementioned embodiments, the resin material is supplied into the pots provided on the lower mold section of the mold assembly for sealing an electronic component with molded resin, the resin heated/melted in the pots is pressed with the plungers to be injected into and charged in the upper and lower mold cavities of the mold sections, a prescribed resin pressure is applied to the resin charged in the upper and lower mold cavities, and the resin received in the upper and lower mold cavities is thereafter pressed against the surfaces of the lead frame from the exterior, whereby the adhesion between the resin mold package molded in the upper and lower mold cavities, the lead frame and the electronic component is improved.

After the prescribed resin pressure is applied to the resin charged in the upper and lower mold cavities, hardening of the melted resin material received in the upper and lower mold cavities gradually progresses with time, whereby the viscosity of the melted resin material is gradually increased so that the resin is solidified through a substantially semi-hardened state before complete hardening.

After the melted resin material is injected into and charged in the upper and lower mold cavities and the prescribed resin pressure is applied to the resin received in the upper and lower mold cavities, the resin pressure in the upper and lower mold cavities is gradually reduced along the progress of hardening of the resin received in the upper and lower mold cavities.

After such reduction of the resin pressure in the upper and lower mold cavities is completely ended, the resin is completely solidified (hardened) in the upper and lower mold cavities.

Due to such hardening (solidification) of the melted resin material in the upper and lower mold cavities, therefore, the resin mold package is molded in the upper and lower mold cavities.

Namely, each of the aforementioned embodiments can employ steps of injecting and charging the melted resin material into and in the upper and lower mold cavities, applying the prescribed resin pressure to the resin charged in the upper and lower mold cavities, and thereafter feeding compressed air to the resin received in the upper and lower mold cavities when the resin charged in the upper and lower mold cavities is not yet completely hardened but still in a substantially semi-hardened state, thereby pressing the resin received in the upper and lower mold cavities against the surfaces of the lead frame from the exterior, for example.

Thus, the adhesion between the resin mold package molded in the upper and lower mold cavities, the lead frame and the electronic component can be improved.

Further, each of the aforementioned embodiments can employ a structure of injecting and charging the melted resin material into and in the upper and lower mold cavities and feeding compressed air to the resin received in the upper and lower mold cavities when the melted resin material is completely charged in the upper and lower mold cavities, thereby pressing the resin received in the upper and lower mold cavities against the surfaces of the lead frame from the exterior, for example.

The structure of feeding compressed air to the resin received in the upper and lower mold cavities when the melted resin material is completely charged in the upper and lower mold cavities can be carried out substantially simultaneously with application of the prescribed resin pressure to the resin charged in the upper and lower mold cavities, or before or after application of the prescribed resin pressure.

Thus, the adhesion between the resin mold package molded in the upper and lower mold cavities, the lead frame and the electronic component can be improved.

Further, each of the aforementioned embodiments may employ any of the following structures:

Each of the aforementioned embodiments can employ a structure of injecting and charging the melted resin material into and in the upper and lower mold cavities, applying the prescribed resin pressure to the resin charged in the mold cavities and feeding compressed air to the resin received in the upper and lower mold cavities under pressure immediately after reduction of the resin pressure in the upper and lower mold cavities is started due to hardening of the resin, thereby pressing the resin received in the mold cavities against the surfaces of the lead frame from the exterior.

Each of the aforementioned embodiments can employ a structure of injecting and charging the melted resin material into and in the upper and lower mold cavities, applying the prescribed resin pressure to the resin charged in the upper and lower mold cavities, and thereafter continuously feeding compressed air to the resin received in the upper and lower mold cavities under pressure during reduction of the resin pressure in the upper and lower mold cavities due to hardening of the resin, thereby pressing the resin received in the upper and lower mold cavities against the surfaces of the lead frame from the exterior.

Each of the aforementioned embodiments can employ a structure of injecting and charging the melted resin material into and in the upper and lower mold cavities, applying the prescribed resin pressure to the resin charged in the upper and lower mold cavities, and feeding compressed air to the resin received in the upper and lower mold cavities under pressure when or immediately before reduction of the resin pressure in the upper and lower mold cavities is completely ended due to hardening of the resin, thereby pressing the resin received in the upper and lower mold cavities against the surfaces of the lead frame from the exterior.

Thus, the adhesion between the resin mold package molded in the upper and lower mold cavities, the lead frame and the electronic component can be improved in each of the aforementioned structures.

In each of the aforementioned embodiments, gas such as nitrogen gas, carbon dioxide gas or argon gas can be employed in place of the compressed air, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of sealing an electronic component with molded resin, comprising:
   an electronic component setting step of engaging an electronic component being mounted on a lead frame in mold cavities being oppositely provided on mold surfaces of a fixed mold section and a movable mold section respectively; and
   a resin sealing step of charging a heated/melted resin material in said mold cavities being engaged with said electronic component and sealing said electronic component and said lead frame around the same being engaged in said mold cavities in a resin mold package corresponding to the shapes of said mold cavities,
   said resin sealing step comprising steps of:
   applying a prescribed resin pressure to said resin being charged in said mold cavities, and
   thereafter pressing said resin being received in said mold cavities against said lead frame from the exterior.

2. The method of sealing an electronic component with molded resin in accordance with claim 1, wherein said step of pressing said resin being received in said mold cavities is carried out by feeding compressed air to said resin being received in said mold cavities under pressure.

3. The method of sealing an electronic component with molded resin in accordance with claim 1, further comprising a step of covering inner surfaces of said mold cavities with mold releasing films along the shapes of said mold cavities,
   said step of pressing said resin being received in said mold cavities is carried out by feeding said compressed air into said mold cavities having said inner surfaces being covered with said mold releasing films under pressure thereby pressing said resin being received in said mold cavities through said mold releasing films.

4. The method of sealing an electronic component with molded resin in accordance with claim 1, wherein said step of pressing said resin being received in said mold cavities is carried out by pressing said resin being received in said mold cavities against said lead frame from the exterior with pressing members being provided on bottom surface portions of said mold cavities.

5. The method of sealing an electronic component with molded resin in accordance with claim 1, wherein said step of pressing said resin being received in said mold cavities is carried out by closing said fixed mold section and said movable mold section being closed with a prescribed low closing pressure further with a prescribed high closing pressure.

6. The method of sealing an electronic component with molded resin in accordance with claim 1, further comprising a step of mounting heat radiating plates on inner bottom surfaces of said mold cavities,
   said step of pressing said resin being received in said mold cavities being carried out by feeding said compressed air to said heat radiating plates from the exterior, thereby pressing said resin against said lead frame through said heat radiating plates.

7. The method of sealing an electronic component with molded resin in accordance with claim 1, further comprising a step of mounting heat radiating plates on inner bottom surfaces of said mold cavities,
   cavity bottom surface members provided on bottom surfaces of said mold cavities being prepared from porous materials having continuous pores being opened on surfaces closer to said bottom surfaces of said mold cavities,
   said step of pressing said resin being received in said mold cavities being carried out by feeding said compressed air into said mold cavities under pressure through said continuous pores, thereby pressing said resin against said lead frame through said heat radiating plates.

8. The method of sealing an electronic component with molded resin in accordance with claim 1, further comprising a step of covering inner surfaces of said mold cavities with mold releasing films along the shapes of said mold cavities,
   mold members comprising at least said mold cavities being prepared from porous materials having continuous pores being opened on overall said inner surfaces of said mold cavities,
   said step of pressing said resin being received in said mold cavities being carried out by feeding said compressed air into said mold cavities having said inner surfaces being covered with said mold releasing films through said continuous pores and pressing said resin being received in said mold cavities through said mold releasing films.

9. The method of sealing an electronic component with molded resin in accordance with claim 1, wherein said step of pressing said resin being received in said mold cavities is carried out by feeding said compressed air into said mold cavities under pressure when said resin being charged in said mold cavities is not yet completely hardened but still in a substantially semi-hardened state.

10. The method of sealing an electronic component with molded resin in accordance with claim 1, wherein said step of pressing said resin being received in said mold cavities is carried out by feeding said compressed air into said mold cavities when said melted resin material is completely charged in said mold cavities.

11. The method of sealing an electronic component with molded resin in accordance with claim 1, wherein said step of pressing said resin being received in said mold cavities is carried out by feeding said compressed air into said mold cavities under pressure immediately after reduction of said resin pressure in said mold cavities is started by hardening of said resin in said mold cavities.

12. The method of sealing an electronic component with molded resin in accordance with claim 1, wherein said step of pressing said resin in said mold cavities is carried out by continuously feeding said compressed air into said mold cavities under pressure during reduction of said resin pressure in said mold cavities caused by hardening of said resin in said mold cavities.

13. The method of sealing an electronic component with molded resin in accordance with claim 1, wherein said step of pressing said resin in said mold cavities is carried out by feeding said compressed air into said mold cavities under pressure when reduction of said resin pressure in said mold cavities is completed by hardening of said resin in said mold cavities.

14. The method of sealing an electronic component with molded resin in accordance with claim 3, wherein converging tubes being formed to be opened in inner surfaces of said mold cavities are provided on said fixed mold section and said movable mold section respectively,
   said step of pressing said resin being received in said mold cavities being carried out by feeding said compressed air into said mold cavities having said inner surfaces being covered with said mold releasing films through said converging tubes.

15. The method of sealing an electronic component with molded resin in accordance with claim 3, wherein cavity bottom surface members being provided on bottom surfaces of said mold cavities are prepared from porous materials having continuous pores being opened on surfaces closer to said bottom surfaces of said mold cavities,
   said step of pressing said resin being received in said mold cavities being carried out by feeding said compressed air into said mold cavities having said inner surfaces being covered with said mold releasing films under pressure through said continuous pores.

16. The method of sealing an electronic component with molded resin in accordance with claim 3, wherein mold members comprising at least said mold cavities are prepared from porous materials having continuous pores being opened in overall said inner surfaces of said mold cavities,
   said step of pressing said resin being received in said mold cavities being carried out by feeding said compressed air into said mold cavities having said inner surfaces being covered with said mold releasing films under pressure through said continuous pores.

* * * * *